US000001166H

United States Statutory Invention Registration [19]

[11] Reg. Number: H1166

[43] Published: Apr. 6, 1993

Kim et al.

[54] PROCESS FOR STRENGTHENING SILICON BASED CERAMICS

[75] Inventors: Hyoun-Ee Kim, Oak Ridge; A. J. Moorhead, Knoxville, both of Tenn.

[73] Assignee: The United States of America as represented by the Department of Energy, Washington, D.C.

[21] Appl. No.: 665,854

[22] Filed: Mar. 7, 1991

[51] Int. Cl.[5] ..... C23C 16/00

[52] U.S. Cl. ..... 427/255.3; 427/255; 427/255.2; 427/249; 427/377; 427/399

[58] Field of Search ..... 427/255, 377, 399, 249, 427/255.3

[56] References Cited

U.S. PATENT DOCUMENTS

| | | | |
|---|---|---|---|
| 3,811,928 | 5/1974 | Henney et al. | 427/255 |
| 3,824,120 | 7/1974 | Davidge et al. | 428/446 |
| 4,104,442 | 8/1978 | Sussmuth | 427/377 |
| 4,346,147 | 8/1982 | Barlier et al. | 427/399 |
| 4,434,238 | 2/1984 | Ezis et al. | 501/98 |
| 4,457,958 | 7/1984 | Lange et al. | 427/399 |
| 4,502,983 | 3/1985 | Omori et al. | 501/89 |
| 4,976,099 | 12/1990 | Rousseau et al. | 427/249 |

*Primary Examiner*—Donald P. Walsh
*Assistant Examiner*—Daniel Jenkins
*Attorney, Agent, or Firm*—Katherine P. Lovingood; Stephen D. Hamel; William R. Moser

[57] ABSTRACT

A process for strengthening silicon based ceramic monolithic materials and composite materials that contain silicon based ceramic reinforcing phases that requires that the ceramic be exposed to a wet hydrogen atmosphere at about 1400° C. The process results in a dense, tightly adherent silicon containing oxide layer that heals, blunts , or otherwise negates the detrimental effect of strength limiting flaws on the surface of the ceramic body.

3 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PROCESS FOR STRENGTHENING SILICON BASED CERAMICS

This invention was developed pursuant to a contract with the U.S. Department of Energy, contract number DE-AC05-840R21400.

This invention relates to a process for strengthening silicon based ceramics and particularly to a process of exposing silicon based ceramics to a wet hydrogen atmosphere for a sufficient time and temperature to produce a ceramic that is at least 25% stronger than untreated material.

BACKGROUND OF THE INVENTION

The silicon based ceramics are becoming increasingly important members of the class of materials that are referred to in the United States as advanced ceramics or high performance ceramics and in Japan as "fine ceramics". These materials, which include silicon carbide, silicon nitride, and sialon, are useful both in their monolithic forms as well as when used as the reinforcing phase in ceramic or metal matrix composites. The silicon based ceramics, or composites containing these materials, are the leading candidates for a wide range of applications, including service at both modest and elevated temperatures in such devices as advanced heat engines and heat exchangers. In heat engines these ceramics can be used in wear reducing parts for conventional gasoline or diesel engines, including components such as bearings, valve rocker arm pads, push rod tips, or camshaft roller followers, as well as for in-cylinder components for low heat rejection diesel engines. They could also be useful as small ceramic turbine rotors in the turbocharger of conventional gasoline engines or in relatively small, high efficiency, advanced gas turbine engines that could be used in automobiles or as the auxiliary power units in aircraft. These materials are also of interest in heat exchangers that recover the waste heat from a variety of industrial processes. Finally, there is increasing interest in ceramic cutting tools including those made of silicon nitride, and silicon carbide whisker reinforced alumina, one of the most widely studied composite materials.

Although other factors such as corrosion resistance may occasionally dictate the use of a ceramic for these and other applications, a key factor that is almost always of interest is the strength of the material. Ceramic materials may be strengthened by alloying additions or through steps taken to minimize grain growth, but even then they fail to attain their full potential because of strength limiting surface flaws that are inevitably introduced during fabrication. There is a need, therefore, to improve the strength of silicon based ceramics by a process that can be applied after all conventional fabrication steps have been taken.

SUMMARY OF THE INVENTION

In view of the above needs, it is an object of this invention to provide a process for strengthening objects made of silicon based ceramics or those that contain silicon based ceramics as a reinforcing phase.

It is another object of this invention to provide a process that forms a uniform, stable film of silicon dioxide or other silicon bearing compound that heals or otherwise diminishes the effect of surface flaws that limit the strength of silicon based ceramic bodies or composites.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the process of this invention may comprise exposing objects comprising silicon based ceramics to a gaseous atmosphere consisting essentially of hydrogen and a sufficient amount of water vapor for a sufficient time and temperature to produce an oxide film at the surface that increases the strength of the ceramic. The preferred process uses an atmosphere having partial pressure of water vapor ($P_{H20}$) of about $1\times10^{-4}$ to $1\times10^{-2}$ MPa and a temperature of about 1250° C. to 1550° C. and a time of about 0.5 to 10 hours. Times and temperatures vary, with an increase or decrease in time allowing for a decrease or increase in temperature respectively. The invention provides a ceramic that has a uniform film of silicon dioxide or other silicon bearing compound film that results in strengthening of the ceramic by healing, blunting or otherwise negating the effect of strength limiting surface flaws.

DETAILED DESCRIPTION OF THE PREFERRED EMBODIMENT

The suitability of structural ceramics for many applications are restricted by the strengths of the materials. It is well established that the strengths of these materials are generally only one tenth to one hundredth of that which theoretically should be attainable. This deficiency is particularly true of ceramic components that have been produced with only a normal degree of care.

The reason for this behavior is that ceramics, being brittle materials, fail from the stress induced propagation of microscopically small cracks, not from an overstress condition. These detrimental flaws may originate either from defects such as pores, particle agglomerates or microcracks introduced into the material during the sintering process, or as the result of operations such as slicing or grinding that are performed after sintering. Because the failure of a ceramic material is so dependent on the population and distribution of such flaws, the strength of a ceramic is statistical in nature, depending on the probability that a flaw severe enough to cause fracture at a given applied stress is present in the volume of material that is exposed to the peak stress. Thus, it follows, that the observed strength is related to the volume or surface area under stress and the number and severity of flaws in that volume or surface area.

It has been experimentally determined that the most damaging flaws in a ceramic body are those at or very near the surface, and particularly those at a surface which experiences tensile forces, since cracks tend to open and propagate under tensile forces. Thus a ceramic material can be strengthened by altering the surface region to remove, reduce, or reduce the size of strength limiting surface flaws. This may be done in some cases by a mechanical operation such as polishing the surface to a mirror like finish, but this is not a practical solution for most commercial ceramic products.

Figure 1:
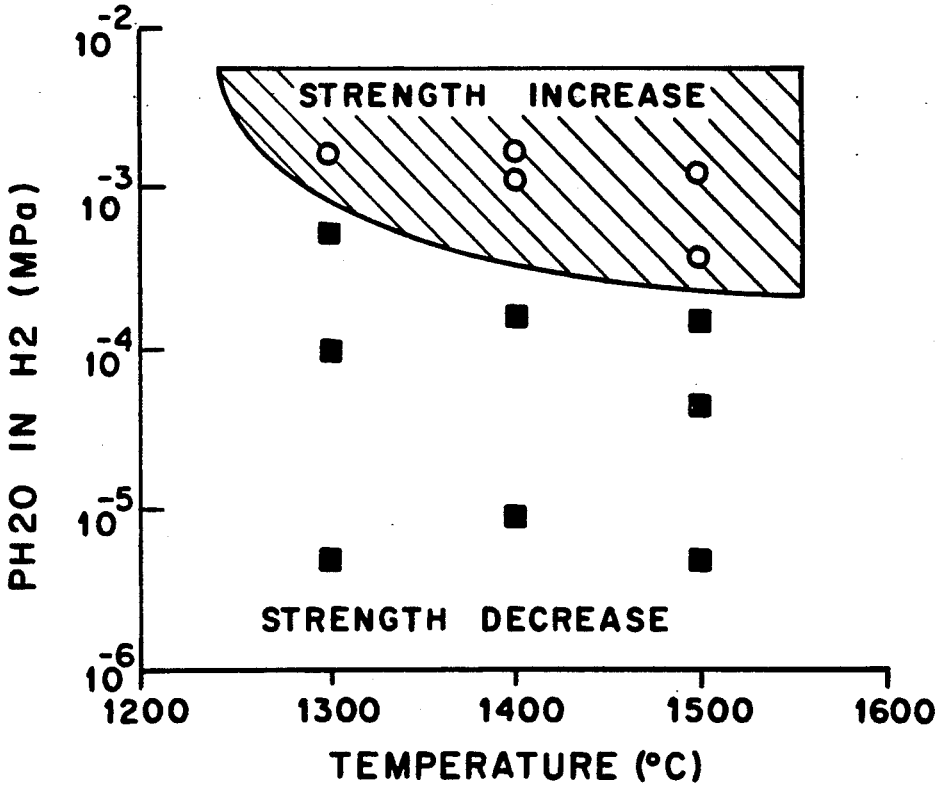
FIG. 1. Range of temperatures and water vapor content of hydrogen atmospheres shown to increase the strength of silicon based ceramics following exposure for times of 0.5 hours or more.

It has been found, however, that the surfaces of silicon based ceramic bodies can be modified by a simple heat treatment in a carefully controlled atmosphere of hydrogen containing water levels over a relatively narrow range. During this process, silicon in the ceramic combines with water in the gaseous atmosphere to form a dense, tightly adherent film of silicon dioxide ($SiO_2$) that heals, blunts, or otherwise negates the effect of the always present strength limiting surface flaws. Although, in many cases the beneficial film has been found to be pure silica, as will be seen below, the silica sometimes reacts with other materials such as the compounds used to promote sintering of the ceramic to form an equally helpful surface layer. Tests indicated that silicon based ceramics were strengthened when water vapor pressures were above 1 x $10^{-4}$ MPa and temperatures were above 1250° C. as shown in FIG. 1.

The ceramics silicon carbide (SiC), silicon nitride ($Si_3N_4$), and a composite of aluminum oxide ($Al_2O_3$) containing silicon carbide whiskers have all been strengthened by at least 25% after being processed in the manner of this invention. Similar behavior would be expected in other materials, such as sialon, that also contain silicon compounds.

The compositions and processes described in the following examples are intended to be illustrative and not in any way a limitation on the scope of the invention. Persons of ordinary skill in the art should be able to envision variations on the general principle of this invention that fall within the scope of the generic claims the follow.

The time, temperature and other parameters required for various steps in the process will be expected to vary according to the size, shape, specific composition, and other properties of the article or other components involved in the process steps. Parameters may also be affected by variations in equipment used or in other conditions present in the process environment. The term "sufficient" and its derivatives are used to indicate expected allowances for these variations.

EXAMPLE 1

A single batch of sintered alpha-Sic, tradename Carborundum's Hexology SA, was used in this study. Flexure bars with dimensions of 2.5×3.2×25 mm were cut from 25×50 mm SiC plates after the tensile surface was ground with a 180 grit diamond abrasive wheel and polished with diamond pastes down to a grit size of 0.5 micrometers. The edges of the tensile face of each sample were beveled on a 15 micrometer grit diamond wheel.

The flexure bars were exposed to flowing $H_2$ containing different $P_{H20}$ for 10 h at 1300° C. or 1400° C. in resistance heated, alumina tube furnaces. The $H_2$ gas was first purified with $CaSO_4$ and active alumina. A liquid nitrogen cold trap was used to further decrease $P_{H20}$ in some cases. The $P_{H20}$ was controlled by bubbling, at various flow rates, $H_2$ through distilled water, and measured with a hygrometer. The gas flowed parallel to the tensile surface of the samples with a constant speed of 0.9 cm/sec (STP). Eight flexure bars were exposed at each set of environmental conditions. After the exposures, four-point bend flexure tests were performed at room temperature with a cross head speed of 0.008 cm/sec, and inner and outer spans of 6.35 mm and 19.05 mm, respectively.

Figure 2:
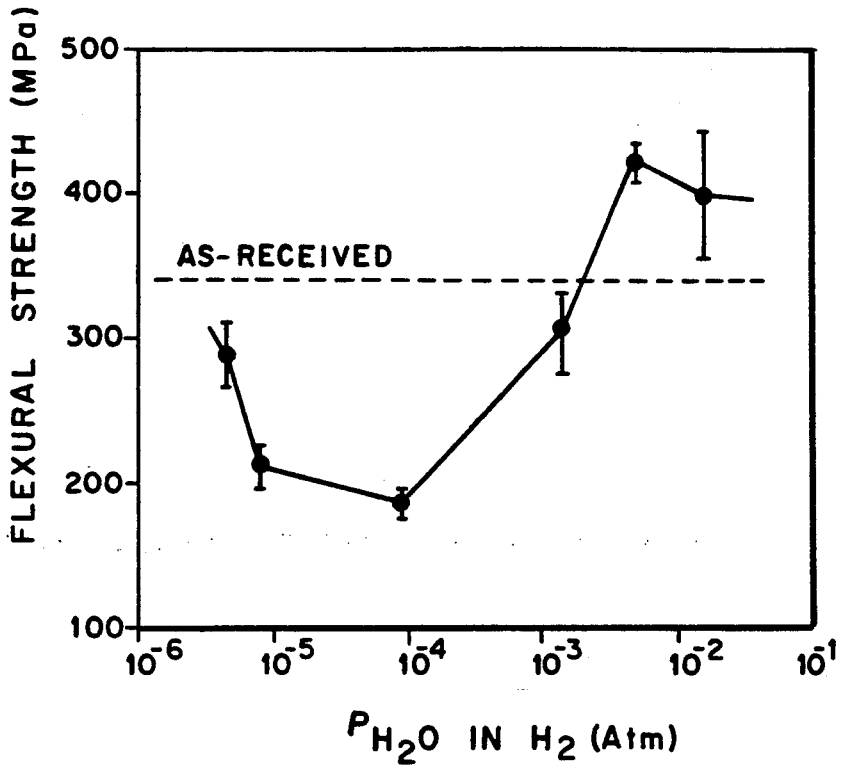
FIG. 2. Room-temperature flexural strength of sintered alpha-SiC exposed for 10 h at 1400° C. in flowing $H_2$ containing various amounts of water vapor. Error bars represent + one standard deviation.

A strong dependency of the flexural strength of sintered alpha-SiC on $P_{H20}$ in $H_2$ was observed. The average room temperature strengths of samples exposed to $H_2$-$H_2O$ atmospheres at 1400° C. for 10 h are shown in FIG. 2. When the $P_{H20}$ in $H_2$ was low, reductions in strength were observed. When the water vapor ($P_{H2O}$) in the hydrogen atmospheres was greater than about $2\times10^{-4}$ MPa ($2\times10^{-3}$ atm) the strength of the exposed silicon carbide was greater than that of the unexposed material. When the $P_{H2O}$ in the hydrogen was about $5\times10^{-4}$ MPa ($5\times10^{-3}$ atm) the strength of the silicon carbide was 450 MPa, a value 30% greater than that of the unexposed ceramic.

Figure 3:
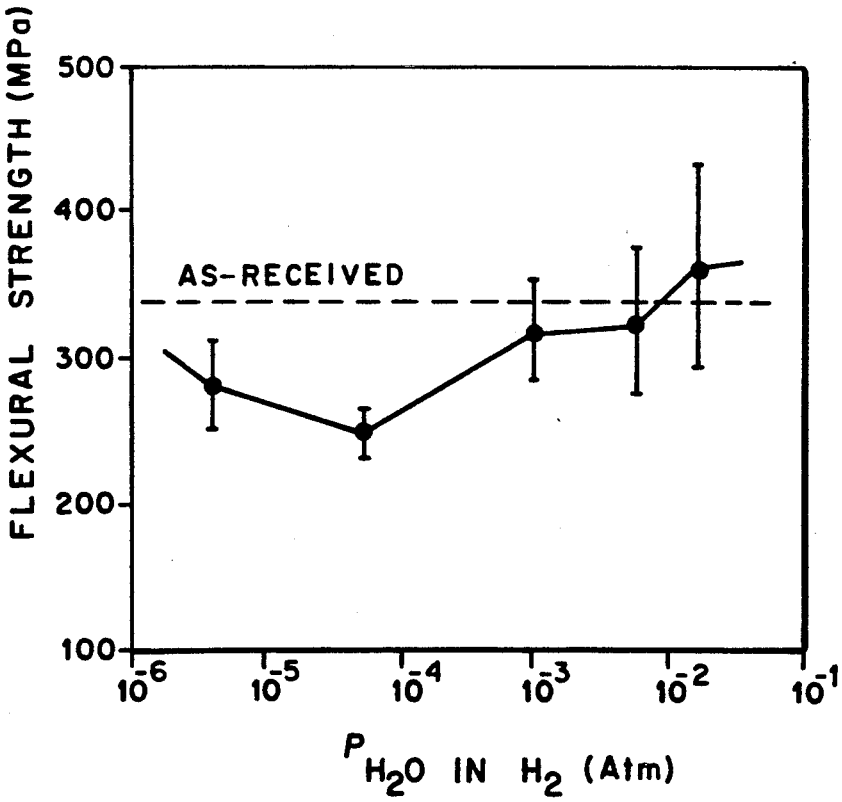
FIG. 3. Room-temperature flexural strength of alpha-SiC exposed for 10 h at 1300° C. in flowing $H_2$ containing various amounts of water vapor.

The above detailed experiment was repeated, but with the exposures being conducted at 1300° C. These results are illustrated for 10 hour exposures at 1300° C. in FIG. 3. The magnitude of the increase was about 10%.

EXAMPLE 2

A single batch of commercially available $Si_3N_4$, tradename GTE's grade AY6, with 6 wt% $Y_2O_3$ and 1.5 wt% $Al_2O_3$ as sintering aids was the primary material used in this example. The material was procured in the form of injection molded, hot isostatically pressed bars having approximate dimensions of 5 mm ×8 mm ×57 mm. Four smaller flexure bar specimens with dimensions of 2.5 mm ×3.2 mm ×25 mm were cut from each of the larger bars. The preparation of the flexural bar samples and the experimental details of the exposure process and testing conditions were the same as those detailed in Example 1.

Figure 4:
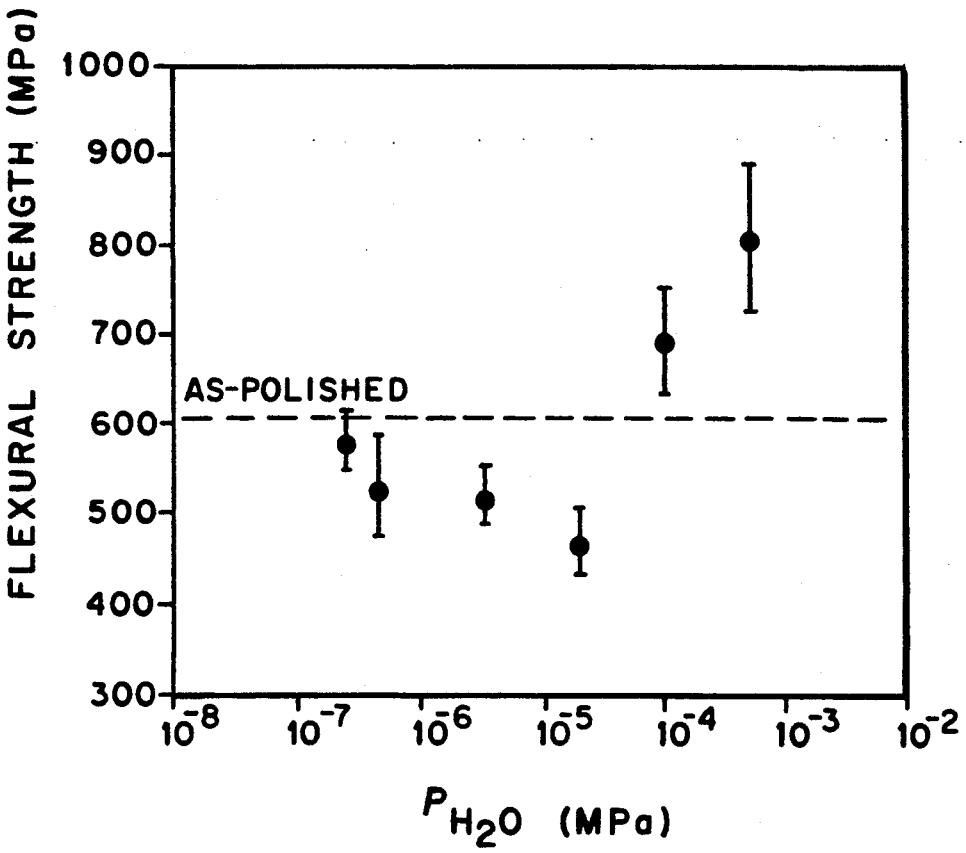
FIG. 4. Room-temperature flexural strength of HIP-$Si_3N_4$ after exposure for 10 h at 1400° C. to flowing $H_2$ containing various levels of $H_2O$.
Figure 5:
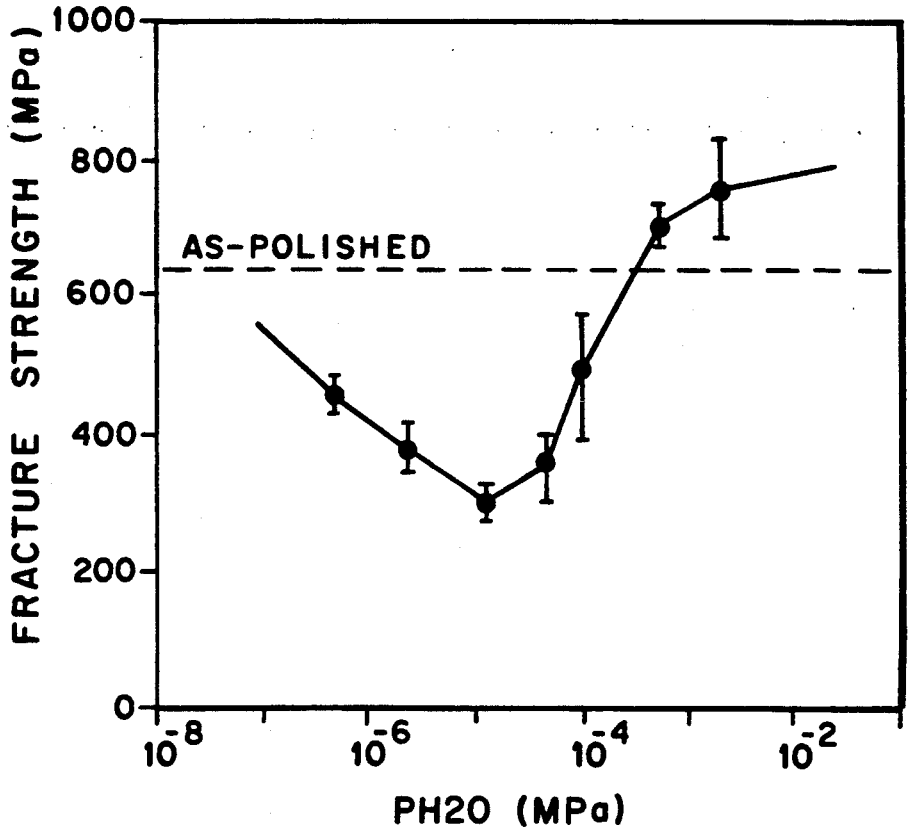
FIG. 5. Room temperature flexural strength of silicon carbide whisker reinforced alumina matrix composite following exposure at 1400° C. to flowing $H_2$ containing various levels of water vapor.

Groups of five flexure bar specimens of the HIP-$Si_3N_4$ were exposed for 10 h at 1400° C. in a resistance-heated, 6.35-cm-ID, horizontal alumina-tube furnace. The results of this series of exposures are illustrated in FIG. 4. This silicon based ceramic responded to the water levels in the hydrogen atmosphere in a manner similar to that observed in Example 1 when silicon carbide was exposed under such conditions. In the case of this $Si_3N_4$, the maximum strength attained following this process was 805 MPa, a 30% increase in the strength of the material. The surface layer was identified by x-ray diffraction as $Y_2Si_2O_7$ instead of the $SiO_2$ observed on the surface of the SiC after exposure. The $Y_2Si_2O_7$ was formed when $SiO_2$, resulting from the reaction of the $Si_3N_4$ with water in the hydrogen, subsequently reacted with the $Y_2O_3$ and $Al_2O_3$ sintering aids present in the silicon nitride ceramic.

EXAMPLE 3

A series of flexure bars were prepared, as in Example 1, from a SiC whisker reinforced alumina ($Al_2O_3$-$Sic_w$) composite material that contained 20 vol % SiC whiskers. The flexural strengths of the material were studied as functions of time, temperature, and $P_{H2O}$ in a series of $H_2$-$H_2O$ environments. The details of sample preparation, exposure, and mechanical testing are the same as given in Example 1. The strength of this composite material was strongly dependent on the $P_{H2O}$ level in the environment. When the $P_{H2O}$ in the $H_2$ atmosphere was low, active oxidation of the SiC whiskers in the composite occurred, resulting in severe reductions in the strength of the samples. As the water vapor level was increased, the reductions in strength became less severe. When the composite was exposed at 1400° C. to $H_2$ atmospheres containing water vapor pressures of about $2\times10^{-4}$ MPa and above, the strength of the material was significantly higher than that of the unexposed material. The strongest material was produced following treatment for 10 hours at 1400° C. to a hydrogen atmosphere with a $P_{H2O}$ of $2\times10^{-3}$ MPa ($2\times10^{-2}$ atm). These exposure conditions strengthened the composite by about 18%, to a value of 755 MPa. In light of the fact that the composite contained only 20% of the SiC whiskers, the increase in strength was comparable to that observed in our previous studies on other Si-bearing ceramics (SiC and $Si_3N_4$). Similar dependencies of strength on the level of $H_2O$ in the atmosphere were noted following the exposures at 1300° C. with the effects being lesser in magnitude.

We claim:

1. A process for strengthening a composition of matter comprising silicon based ceramics, said process comprising:

exposing said composition of matter to a gaseous atmosphere consisting essentially of hydrogen and a sufficient amount of water vapor for a sufficient time and sufficient temperature to produce an oxide film at the surface of said ceramic that increases the strength of said composition of matter.

2. The process of claim 1 wherein said sufficient water vapor is $P_{H20}$ =about $1\times10^{-4}$ to $1\times10^{-2}$ MPa, said sufficient time is about 0.5 to 10 hours and said sufficient temperature is about 1250° C. to 1550° C.

3. The process of claim 1 wherein said sufficient water vapor is about $P_{H20}=5\times10^{-4}$ MPa, said sufficient time is about 2 hours, and said sufficient temperature is about 1400° C.

* * * * *